(12) United States Patent
Xu et al.

(10) Patent No.: US 9,176,350 B2
(45) Date of Patent: Nov. 3, 2015

(54) PIXEL ARRAY AND LIQUID CRYSTAL DISPLAY DEVICE

(71) Applicants: Shanghai AVIC Optoelectronics Co., Ltd., Shanghai (CN); Tianma Micro-Electronics Co., Ltd., Shenzhen (CN)

(72) Inventors: Xin Xu, Shanghai (CN); Zhiqiang Xia, Shanghai (CN); Dongliang Dun, Shanghai (CN)

(73) Assignees: Shanghai AVIC Optoelectronics Co., Ltd., Shanghai (CN); Tianma Micro-Electronics Co., Ltd., Shenzhen (CN)

( * ) Notice: Subject to any disclaimer, the term of this patent is extended or adjusted under 35 U.S.C. 154(b) by 0 days.

(21) Appl. No.: 14/283,141

(22) Filed: May 20, 2014

(65) Prior Publication Data
US 2015/0042916 A1 Feb. 12, 2015

(30) Foreign Application Priority Data
Aug. 7, 2013 (CN) .......................... 2013 1 0342941

(51) Int. Cl.
G02F 1/1337 (2006.01)
G02F 1/1343 (2006.01)
H01L 27/12 (2006.01)
G02F 1/1362 (2006.01)
G02F 1/1368 (2006.01)
G09G 3/36 (2006.01)

(52) U.S. Cl.
CPC ........ *G02F 1/134336* (2013.01); *G02F 1/1368* (2013.01); *G02F 1/133707* (2013.01); *G02F 1/136286* (2013.01); *G09G 3/3648* (2013.01); *H01L 27/1255* (2013.01); *G09G 3/3614* (2013.01); *G09G 2300/0426* (2013.01)

(58) Field of Classification Search
CPC ..................... G02F 1/136286; G02F 1/133707
See application file for complete search history.

(56) References Cited

FOREIGN PATENT DOCUMENTS

CN 101387804 A 3/2009
KR 20030050895 A 6/2008

*Primary Examiner* — Phu Vu
(74) *Attorney, Agent, or Firm* — Alston & Bird LLP

(57) ABSTRACT

A pixel array includes: pixel units, data lines quantitatively corresponding to the number of columns N of the pixel units, and scan lines quantitatively corresponding to the number of rows of the pixel units, wherein transistors in the pixel units are arranged in the same direction; the pixel units in the same row are connected to the same scan line; the pixel units in each column and in odd rows are connected respectively to corresponding one of the data lines; the pixel units in each column and in even rows are connected respectively to corresponding one of the data lines; and the pixel units in the nth column and in even rows and the pixel units in the n+1 th column and in odd rows are connected to the same data line, where n=1, 2, ..., N.

14 Claims, 13 Drawing Sheets

| + | − | + | − | + | − |
|---|---|---|---|---|---|
| − | + | − | + | − | + |
| + | − | + | − | + | − |
| − | + | − | + | − | + |

PIXEL ARRAY AND LIQUID CRYSTAL DISPLAY DEVICE

CROSS-REFERENCES TO RELATED APPLICATIONS

This application claims the benefit of priority to Chinese Patent Application No. 201310342941.9, filed with the Chinese Patent Office on Aug. 7, 2013 and entitled "PIXEL ARRAY AND LIQUID CRYSTAL DISPLAY DEVICE", the content of which is incorporated herein by reference in its entirety.

TECHNICAL FIELD

The present invention relates to the field of liquid crystal display, and particularly to a pixel array and a liquid crystal display device.

BACKGROUND OF THE INVENTION

With the development of technology, liquid crystal display device has become one of the most widely used flat panel display devices. An existing liquid crystal display device generally includes a scan drive circuit, a data drive circuit and a pixel array. FIG. 1 is a schematic diagram showing an existing pixel array. As shown in FIG. 1, the pixel array includes: a plurality of scan lines G1 to Gm, a plurality of data lines D1 to D(n+1), and a plurality of pixel units P11 to Pmn.

Specifically, the scan drive circuit of the liquid crystal display device is adapted to send corresponding scan signals to the plurality of scan lines G1 to Gm, and the data drive circuit is adapted to send data signals to the plurality of data lines D1 to D(n+1). The pixel units receive the data signals on the corresponding data lines when driven by the scan signals on the corresponding scan lines.

By way of example, the pixel unit P11 receives the data signal on the data line D1 to perform display when driven by the scan signal of the scan line G1; the pixel unit P12 receives the data signal on the data line D2 to perform display when driven by the scan signal on the scan line G1; the pixel unit P21 receives the data signal on the data line D2 to perform display when driven by the scan signal on the scan line G2; the pixel unit P22 receives the data signal on the data line D3 to display when driven by the scan signal on the scan line G2; and so on.

In the pixel array shown in FIG. 1, each of the data lines controls staggeringly the pixel units in its two adjacent columns (the nth column and the n−1 th column). For example, the data line D3 controls the pixel unit P13, the pixel unit P22, the pixel unit P33, . . . , and the pixel unit Pm2. This pixel structure is referred to as a Zigzag structure.

In order to prevent deterioration of the liquid crystal, typically, the polarity of the data signal applied to the pixel unit is inversed periodically to drive the pixel unit. In the pixel structure shown in FIG. 1, the effect of dot inversion can be achieved only through column inversion. FIG. 2 is a schematic diagram of the picture X displayed by the pixel array shown in FIG. 1; and FIG. 3 is a schematic diagram of the picture (X+1) displayed by the pixel array shown in FIG. 1. Specifically, the picture X and the picture (X+1) are two adjacent frames, that is to say, the picture (X+1) is displayed immediately after the picture X has been displayed.

As shown in FIG. 2 and FIG. 3, to make the picture X and the picture (X+1) have the characteristic of dot inversion, the data signals of the two adjacent data lines have opposite polarities in the same frame; and the data signals of the same data line have opposite polarities in two adjacent frames. For example, in the frame of the picture X shown in FIG. 2, the polarity of the data signal of the data line D1 is positive, the polarity of the data signal of the data line D2 is negative, and the polarity of the data signal of the data line D3 is positive. Thereby, the polarity of the pixel unit P11 is positive, the polarity of the pixel unit P12 is negative, the polarity of the pixel unit P21 is negative, the polarity of the pixel unit P22 is positive, the polarity of the pixel unit P31 is positive, the polarity of the pixel unit P32 is negative, . . . , and so on. And the picture X having the characteristic of dot inversion shown in FIG. 2 is obtained.

In the frame of the picture (X+1) shown in FIG. 3, the polarity of the data signal of the data line D1 becomes negative, the polarity of the data signal of the data line D2 becomes positive, and the polarity of the data signal of the data line D3 becomes negative. Thereby, the polarity of the pixel unit P11 is negative, the polarity of the pixel unit P12 is positive, the polarity of the pixel unit P21 is positive, the polarity of the pixel unit P22 is negative, the polarity of the pixel unit P31 is negative, the polarity of the pixel unit P32 is positive, . . . , and so on. And the picture X+1 having the characteristic dot inversion shown in FIG. 3 is obtained.

However, the problem of interlaced flicker exists in the pixel array in the prior art when displaying pictures. The patent application about liquid crystal display device having the characteristic of dot inversion may refer to Chinese Patent Application No. 200810175536.1.

BRIEF SUMMARY OF THE INVENTION

The problem to be solved in the present invention is interlaced flicker occurred in the pixel array in the prior art.

To solve the above problem, a pixel array is provided in the embodiments of the invention. The pixel array includes: pixel units, data lines quantitatively corresponding to the number of columns N of the pixel units, and scan lines quantitatively corresponding to the number of rows of the pixel units, wherein transistors in the pixel units are arranged in a same direction;

the pixel units in a same row are connected to the same scan line;

the pixel units in each column and in odd rows are connected respectively to corresponding one of the data lines;

the pixel units in each column and in even rows are connected respectively to corresponding one of the data lines; and the pixel units in the nth column and in even rows and the pixel units in the n+1 th column and in odd rows are connected to the same data line, where n=1, 2, . . . , N−1.

To solve the above problem, a pixel array is provided in the embodiments of the invention. The pixel array includes: pixel units, data lines quantitatively corresponding to the number of columns N of the pixel units, and scan lines quantitatively corresponding to the number of rows of the pixel units, wherein transistors in the pixel units are arranged in a same direction;

the pixel units in a same row are connected to the same scan line;

the pixel units in each column and in odd rows are connected respectively to corresponding one of the data lines;

the pixel units in each column and in even rows are connected respectively to corresponding one of the data lines; and the pixel units in the nth column and in even rows and the pixel units in the n−1th column and in odd rows are connected to the same data line, where n=2, . . . , N.

Accordingly, a liquid crystal display device is further provided in the embodiments of the invention. The liquid crystal display device includes: the pixel array described above, a scan drive circuit and a data drive circuit, where the scan drive circuit is connected to the scan lines and adapted to provide corresponding scan signals to the scan lines, and the data drive circuit is connected to the data lines and adapted to provide corresponding data signals to the data lines.

In another embodiment, a pixel array includes N data lines arranged in columns, M scan lines arranged in rows, and N×M transistors forming N×M pixel units disposed along intersections of the N data lines and M scan lines. A first half of M transistors associated with at least a first pair of adjacent data lines have drain regions positioned on a first side of one of the at least first pair of the adjacent data lines to define a first pixel column. A second half of M transistors associated with the at least first pair of adjacent data lines have drain regions positioned on the first side of the other one of the at least first pair of the adjacent data lines to define a second pixel column.

In another embodiment, a pixel array comprising a plurality of pixel units arranged along N columns and M rows, each pixel unit being associated with a different one of a plurality of transistors positioned along intersections of a plurality of data lines and a plurality of scan lines, said data lines being parallel to the N columns and said scan lines being parallel to the M rows. The plurality of transistors are arranged in a same direction. Further, transistors coupled to pth column and qth row are connected to a same date line as transistors coupled to the (p+1)th column and (q+1)th row, wherein p is an integer ranging from 1 to N−1, and q is an integer ranging from 1 to M.

As compared with the prior art, the technical solution of the embodiments of the invention has one or some of the following advantages.

Transistors in the pixel units in the pixel array according to the embodiments of the invention are arranged in the same direction. Thereby it is ensured that the parasitic capacitance of the transistor in two adjacent rows is not different, even if the deviation exists between the overlapped portions of the gate layers and source (drain) layers of the transistors. Thus, the feed-through voltage of the transistors in the pixel array of the embodiments of the invention is consistent, it is ensured that the voltages on the common electrode lines are the same, and the problem of flicker in the pixel units is overcome.

Furthermore, transistors in the pixel array according to the technical solution of the embodiments of the invention are arranged in the same direction, the process for forming the pixel array is simpler, the process flow is simplified, and the cost is reduced.

Furthermore, in the technical solution of the embodiments of the invention, the characteristic of dot inversion can be achieved, as long as data signals with opposite polarities are provided to two adjacent data lines in the same frame, and data signals with opposite polarities are provided to the same data line in two adjacent frames. The data signal required by the technical solution of the embodiments of the invention is very simple and easy to implement, and the power consumption of the liquid crystal display device or the pixel array is reduced.

BRIEF DESCRIPTION OF THE DRAWINGS

FIG. 9 is a schematic diagram of a picture Y displayed by the pixel array shown in FIG. 7;

DETAILED DESCRIPTION OF THE PREFERRED EMBODIMENTS

As described in background of the invention, the problem of interlaced flicker occurs in the pixel array in the prior art when a picture is displayed. It has been found by the inventor that the transistors in two adjacent rows of pixel units in the pixel array in the prior art have different arrangement directions.

Figure 1:
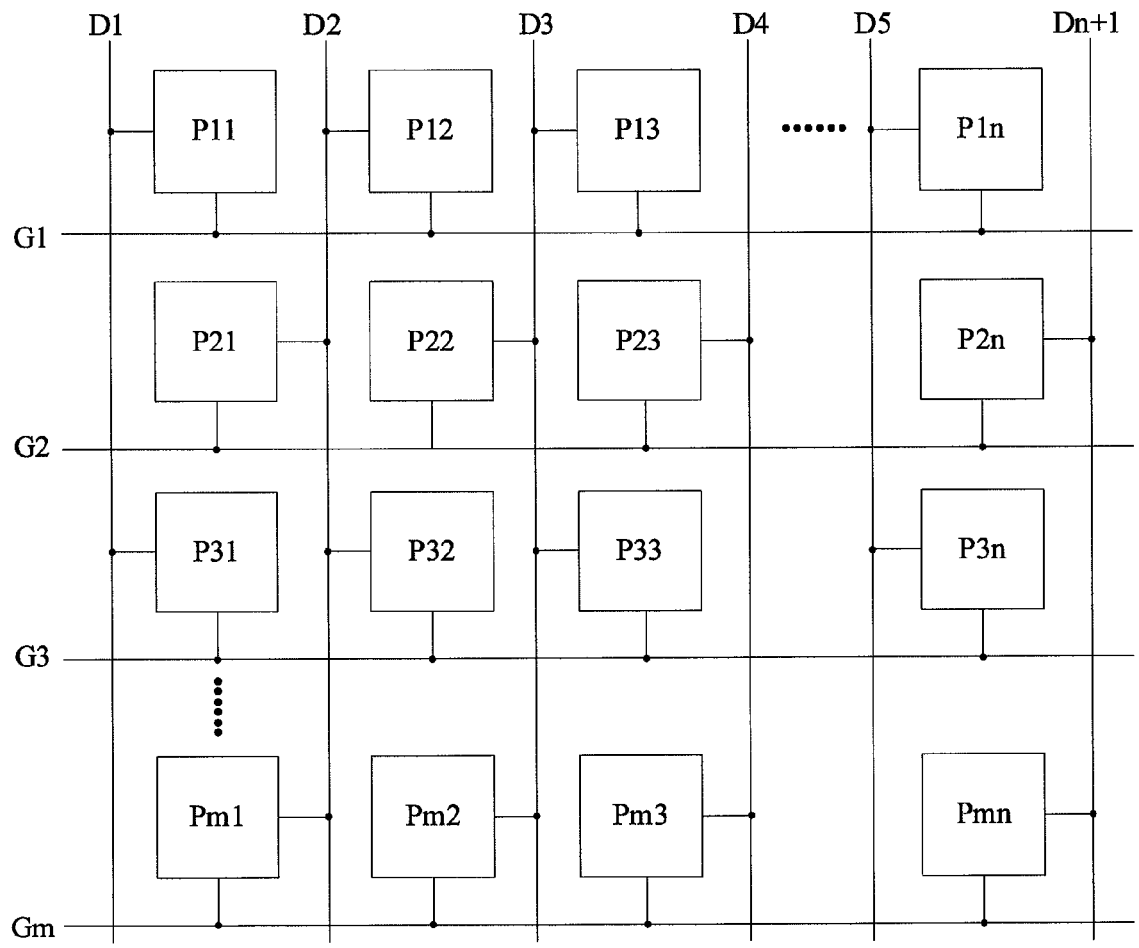
FIG. 1 is a schematic diagram of an existing pixel array.
Figure 2:
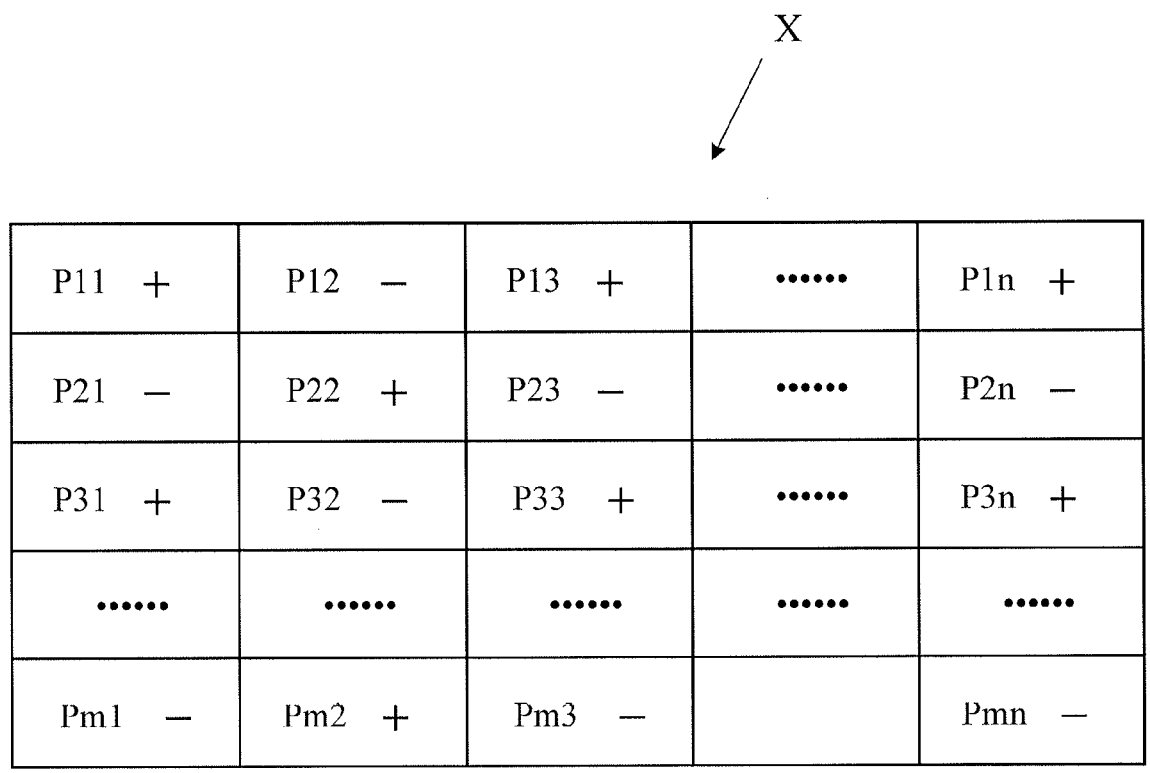
FIG. 2 is a schematic diagram of a picture X displayed by the pixel array shown in FIG. 1.
Figure 3:
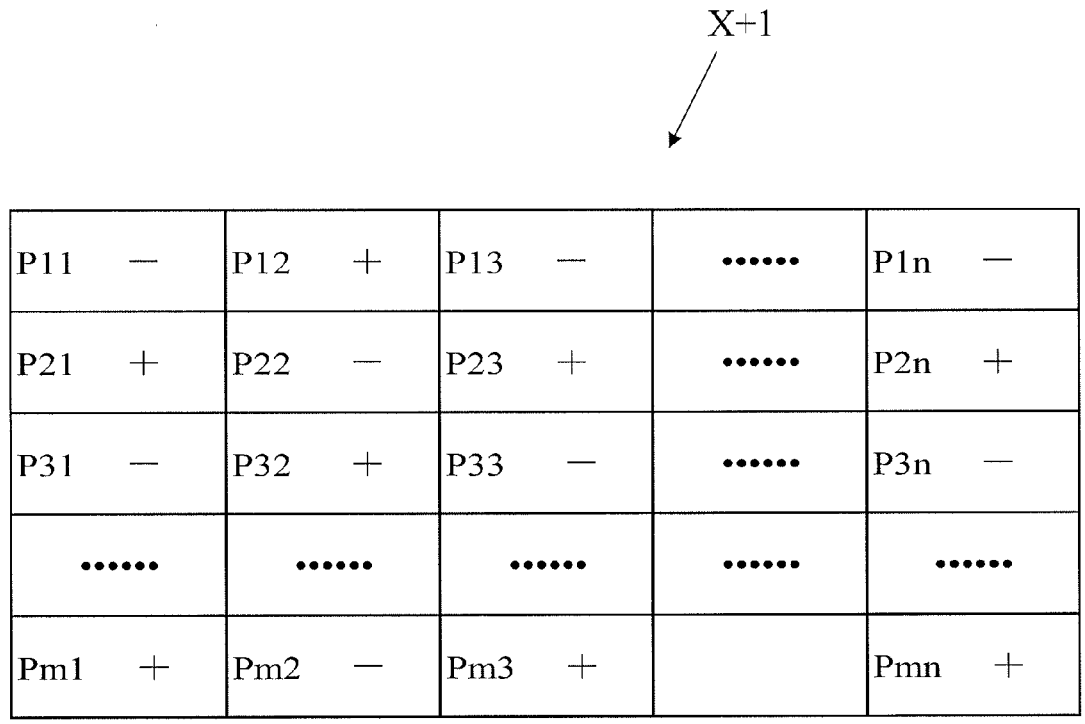
FIG. 3 is a schematic diagram of a picture (X+1) displayed by the pixel array shown in FIG. 1.
Figure 4:
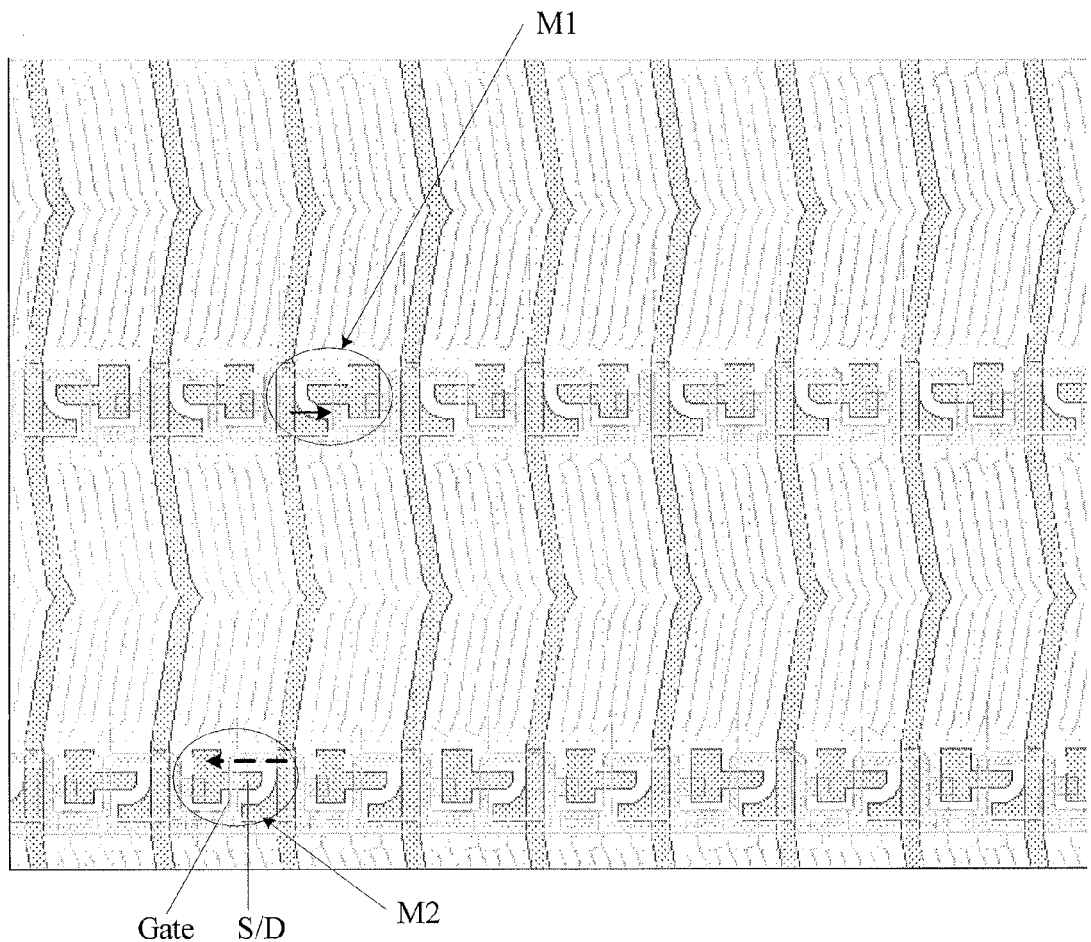
FIG. 4 is a schematic diagram of a channel of transistors in two adjacent rows of pixel units in the prior art.

As shown in FIG. 4, the transistors in two adjacent rows of pixel units in the pixel array in the prior art have opposite channel directions. The charge flow direction of the transistor M1 shown in FIG. 4 is represented by a solid line arrow, and the charge flow direction of the transistor M2 is represented by a dashed arrow. The charge flow directions of the transistors in two adjacent rows are opposite, and the transistor M1 and the transistor M2 have different arrangement directions.

As shown in FIG. 4, a source/drain layer of the transistor M1 and the transistor M2 a gate layer of the transistor M1 and the transistor M2 have an overlapped portion. The deviation exists in the process, so that the deviation occurs between the overlapped portions of the gate layers and the source/drain layers of the transistors. In FIG. 4, for example, if left shift exists when forming the source/drain layer, the overlapped portion of the gate layer and the source/drain layer of transistor M1 is reduced, while the overlapped portion of the gate layer and the source/drain layer of transistor M2 is increased. Thus the parasitic capacitance (Cgs) of the transistor M1 is small, while the parasitic capacitance (Cgs) of the transistor M2 is large. Since the parasitic capacitance of the transistors in two adjacent rows is different, the feed-through voltages of the transistors in two adjacent rows are different. Then the voltages of the common electrodes in two adjacent rows of pixel units are different, and the problem of flicker occurs in the pixel units.

It is found by the inventors through further study on the pixel units in the prior art that the parasitic capacitance of the transistor will be influenced by the wet etching process if the transistors in the pixel units have different arrangement directions.

Figure 5:
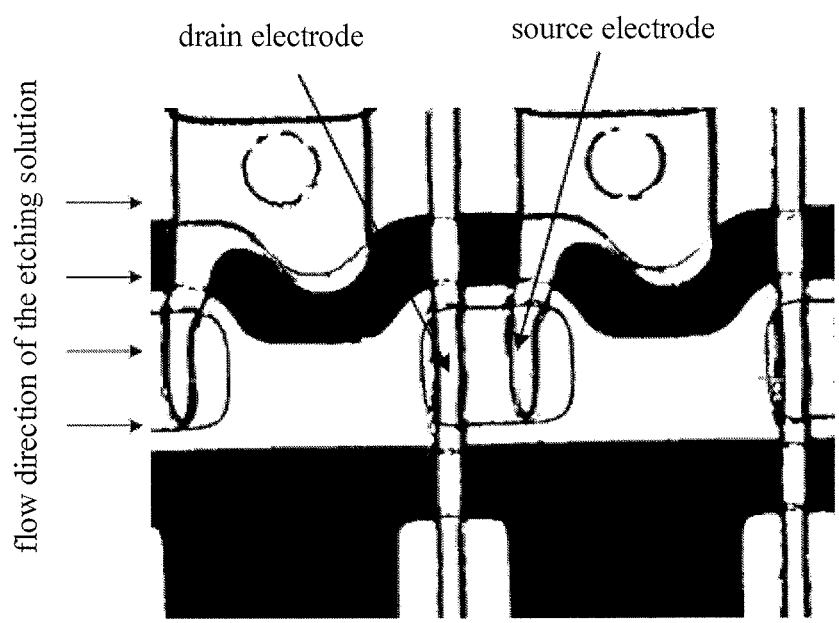
FIG. 5 is a schematic cross-sectional view of one pixel unit in odd rows of the pixel array in the prior art.
Figure 6:
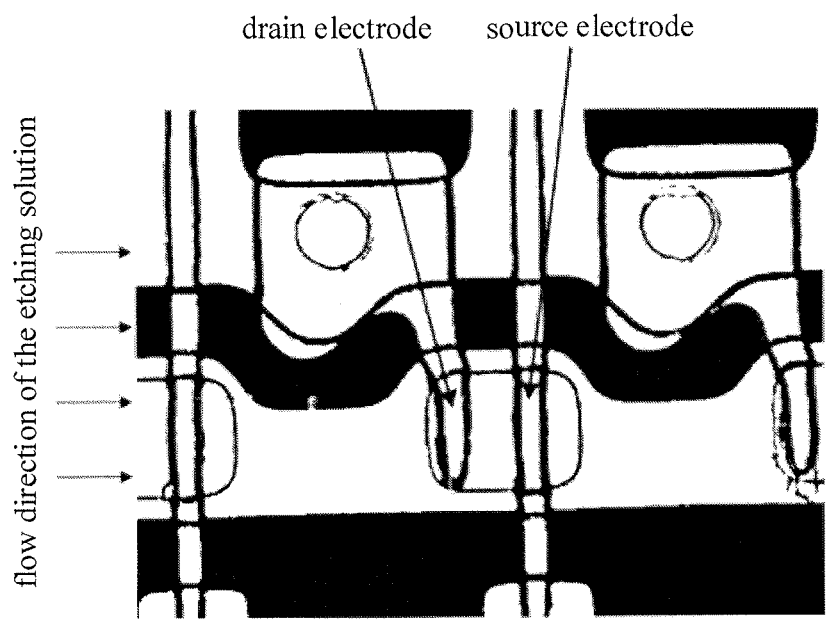
FIG. 6 is a schematic cross-sectional view of one pixel unit in even rows of the pixel array in the prior art.

FIG. 5 is a schematic cross-sectional view showing one pixel unit in some odd row in the pixel array in the prior art; and FIG. 6 is a schematic cross-sectional view showing one pixel unit in some even row in the pixel array in the prior art. As shown in FIG. 5 and FIG. 6, a source electrode and a drain electrode of the transistors in this two pixel units have different relative positions. The source electrode of the transistors in the pixel unit shown in FIG. 5 is on the right side of the drain electrode, while the source electrode of the transistors in the pixel unit shown in FIG. 6 is on the left side of the drain electrode.

The line widths of the source electrode and the drain electrode of these two transistors are designed to be the same. However, directional deviation exists in the wet etching process. That is, in the etching process, the etching solution flows in the same direction, as shown in FIG. 5, the etching solution enters from the left side, the etching quantity of the source electrode in the odd rows during the etching process becomes small since the etching solution is blocked by the drain on the left side, and thereby line width of the source electrode formed by etching is wider. In contrast, as for the even rows shown in FIG. 6, a part of the etching solution is blocked by the source electrode on the left side, and thereby the line width of the drain electrode formed by etching is wider.

The measurement is as follows: the channel length of a transistor shown in FIG. 5 is 4.5 μm, the line width of the source electrode is 1.98 μm, and the line width of the drain electrode is 1.78 μm. The channel length of the transistor shown in FIG. 6 is 4.5 μm, the line width of the source electrode is 1.75 μm an, and the line width of the drain electrode is 1.92 μm.

Since the etching quantity is different, the parasitic capacitances of the transistors in different directions are different, and the problem of interlaced flicker occurs in the pixel array.

Based on the study above, pixel units in a pixel array provided in the embodiments of the invention have the consistent arrangement direction. Thus, even if the calibration deviation occurs in the process, or the etching quantity during the etching process is different, the overlapped portions of the source/drain layer and the gate layer of the transistors change consistently, that is, the overlapped portions have an area increased or reduced simultaneously by the same amount. Therefore the parasitic capacitance of transistors still remain the same, and the problem of flicker in the pixel units in the prior art is overcome.

To make the above objects, features and advantages of the embodiments of the invention easier to be understood, the embodiments of the invention will be described in detail in conjunction with the drawings.

In an embodiment, a pixel array includes: pixel units, data lines quantitatively corresponding to the number of columns N of the pixel units, and scan lines quantitatively corresponding to the number of rows of the pixel units, herein transistors in the pixel units are arranged in the same direction;
  the pixel units in a same row are connected to a same scan line;
  the pixel units in each column and in odd rows are connected respectively to corresponding one of the data lines;
  the pixel units in each column and in even rows are connected respectively to corresponding one of the data lines; and
  the pixel units in the nth column and in even rows and the pixel units in the n+1 th column and in odd rows are connected to a same data line, where n=1, 2, . . . , N−1.

In this embodiment, the pixel units are arranged in a matrix, but the embodiment of the invention is not limited thereto. And in other embodiments, the pixel units may be arranged in other structures.the pixel units may be arranged in other structures.the pixel units may be arranged in other structures.

In another embodiment, a pixel array comprising a plurality of pixel units arranged along N columns and M rows, each pixel unit being associated with a different one of a plurality of transistors positioned along intersections of a plurality of data lines and a plurality of scan lines, said data lines being parallel to the N columns and said scan lines being parallel to the M rows. The plurality of transistors are arranged in a same direction. Further, transistors coupled to pth column and qth row are connected to a same date line as transistors coupled to the (p+1)th column and (q+1)th row, wherein p is an integer ranging from 1 to N−1, and q is an integer ranging from 1 to M.

In conjunction with the following drawings, the pixel array including four rows and five columns of pixel units is taken as an example below to illuminate, but the embodiment of the invention is not limited thereto.

Figure 7:
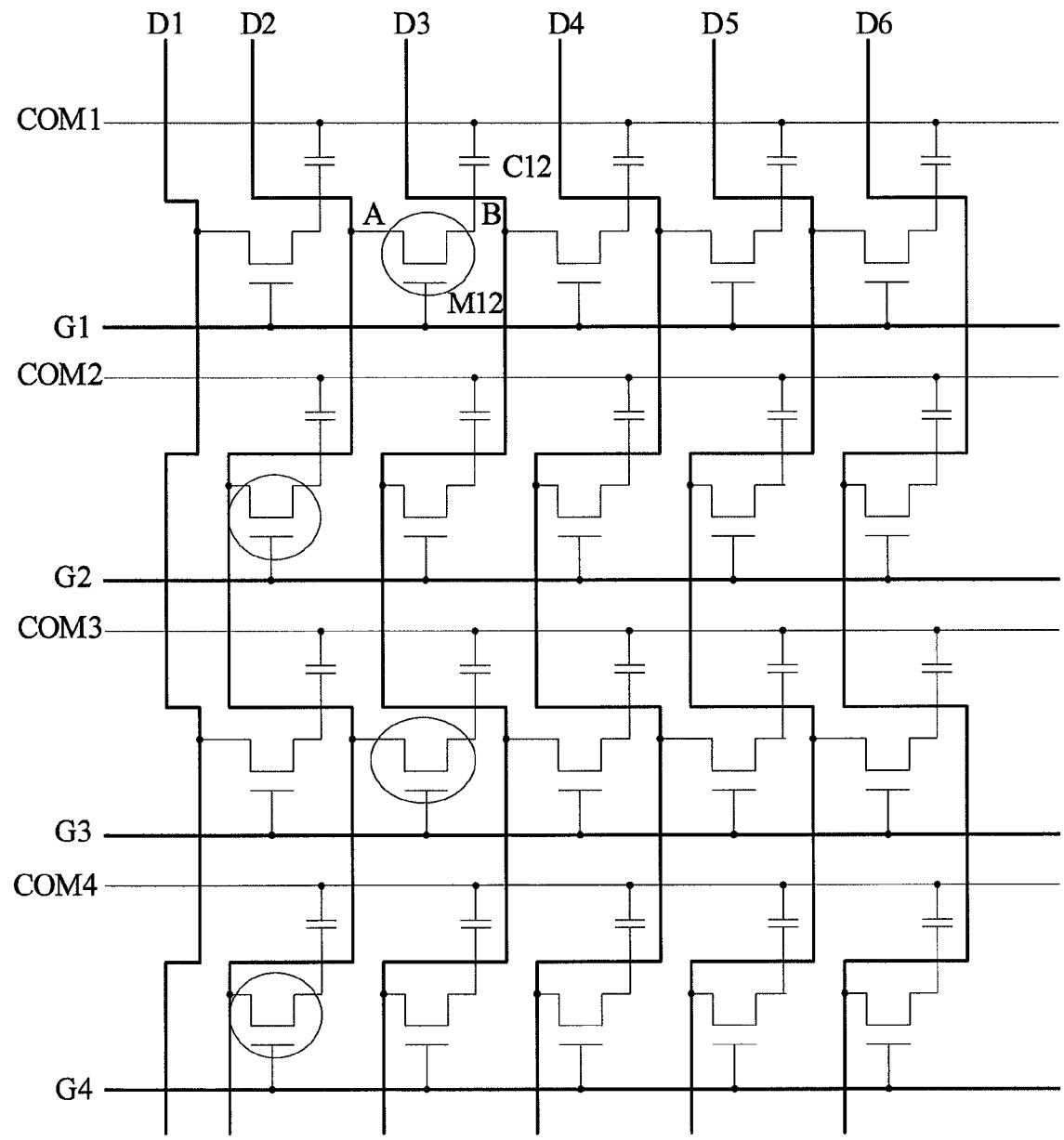
FIG. 7 is an equivalent schematic diagram of a pixel array according to an embodiment of the invention.

As shown in FIG. 7, the pixel array includes: four rows and five columns of pixel units, data lines D1 to D6 and scan lines G1 to G4.

Figure 8:
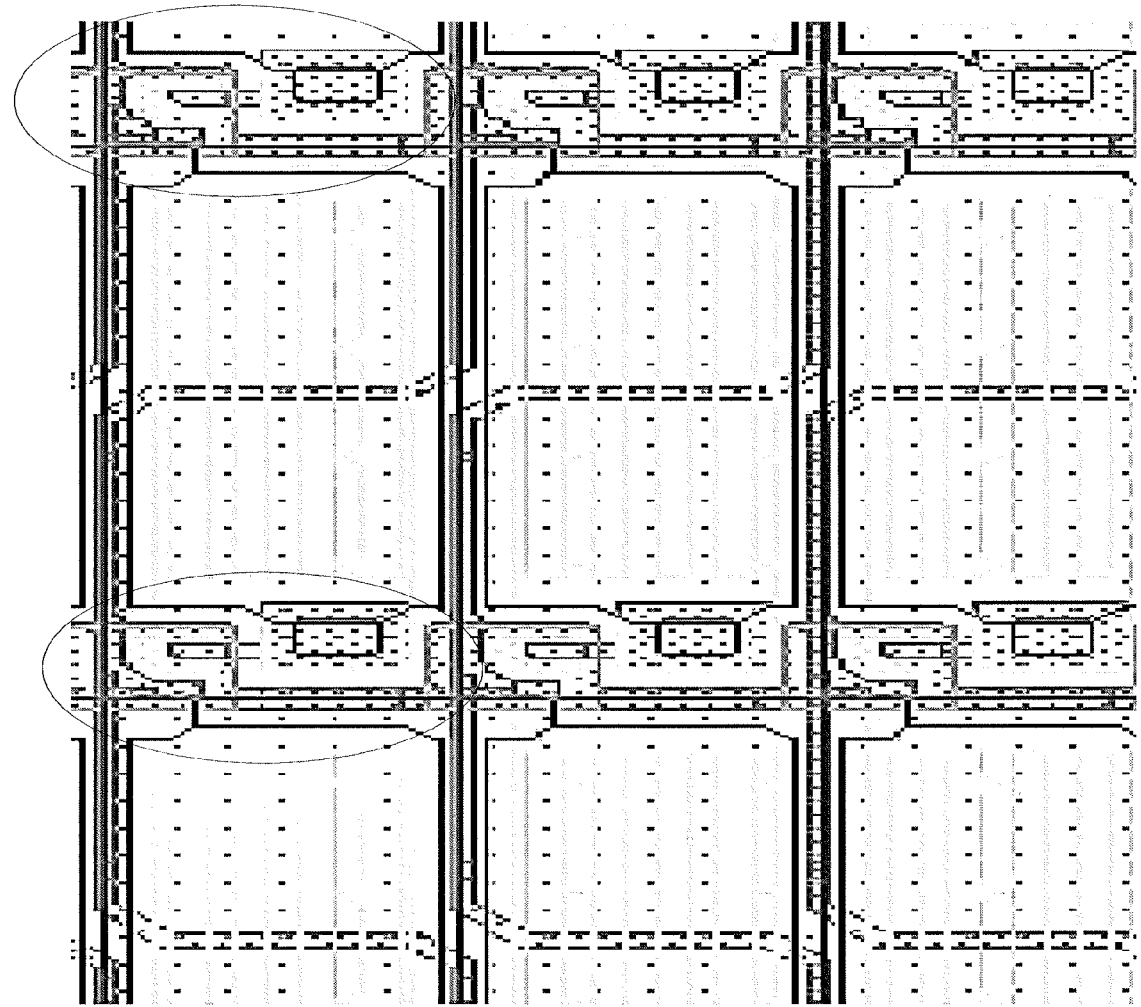
FIG. 8 is a schematic diagram of transistors in two adjacent rows of pixel units in the pixel array shown in FIG. 7.

Specifically, as shown in FIG. 8, transistors in the pixel units in the pixel array are arranged in the same direction. Thus, in the process, if left shift occurs when aligning, the overlapped portions of the source/drain layers and the gate layers of the transistors have an area increased simultaneously by the same amount. In contrast, if right shift occurs when aligning, the overlapped portions of the source/drain layers and the gate layers of the transistors have an area reduced simultaneously by the same amount.

In addition, since transistors in the pixel units according to this embodiment are arranged in the same direction, the influence of the difference of the etching quantity during wet etching process on the parasitic capacitance of transistors is eliminated. The parasitic capacitances of transistors in the pixel units according to this embodiment will not be different with the deviation in the aligning process and the difference in etching quantity any more, so that the same voltages of the common electrodes can be obtained. Therefore, the problem of flicker in the pixel units in the prior art is solved, and the quality of display picture is improved. Furthermore, transistors in the pixel units according to this embodiment are arranged in the same direction, so that the complexity of the production process is reduced, and the process efficiency is improved. And because the desired layout is simple, the cost is reduced.

As shown in FIG. 7, the pixel units in the first row in the pixel array are connected to the scan line G1; the pixel units in the second row in the pixel array are connected to the scan line G2; the pixel units in the third row in the pixel array are connected to the scan line G3; and the pixel units in the fourth row in the pixel array are connected to the scan line G4.

The pixel units in each column and in the first and third rows in the pixel array are connected respectively to corresponding one of the data lines; and the pixel units in each column and in the second and fourth rows in the pixel array are connected respectively to corresponding one of the data lines; and the pixel units in the nth column and in even rows, and the pixel units in the (n+1)th column and in odd rows are connected to the same data line, where n=1, 2, . . . , N−1.

Specifically, four pixel units marked with a circle shown in FIG. 7 are taken as an example, the pixel unit in the second row and in the first column, the pixel unit in the first row and in the second column, the pixel unit in the third row and in the second column, and the pixel unit in the fourth row and in the first column are connected to the same data line D2.

In this embodiment, the data lines in the pixel array have a curved arrangement routing in a manner of exchanging in their adjacent columns. Each of the data lines can control staggeringly the pixel units in any two adjacent rows in its two adjacent columns. Thus the effect of dot inversion can be achieved by the column inversion of the data lines.

Figure 9:
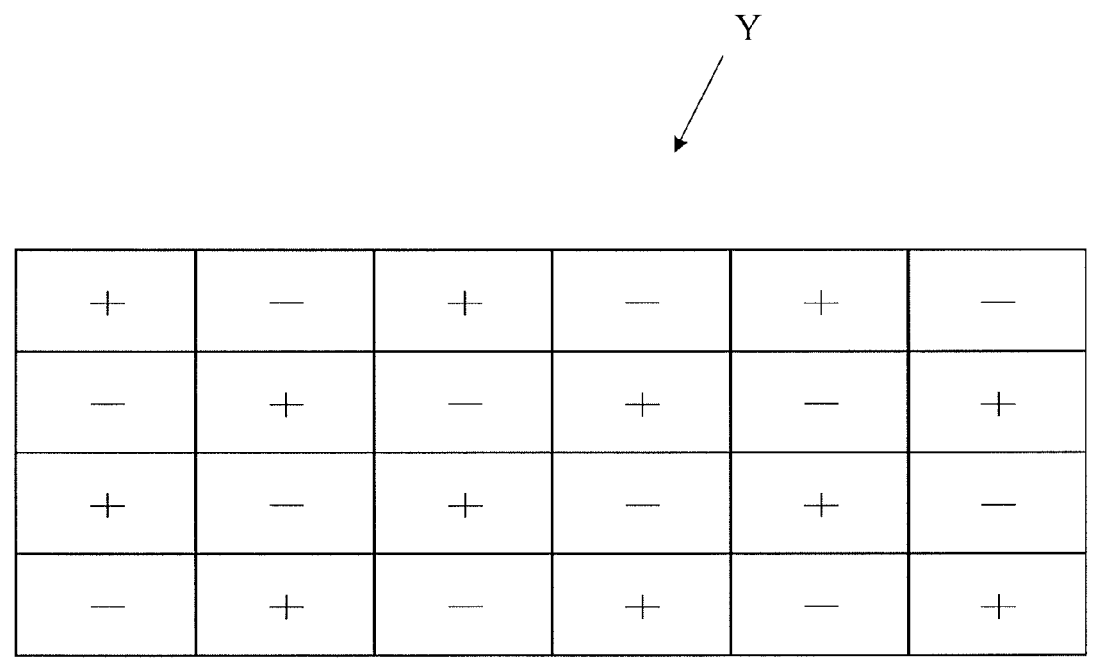
Figure 10:
FIG. 10 is a schematic diagram of a picture (Y+1) displayed by the pixel array shown in FIG. 7.

FIG. 9 is a schematic diagram showing a picture Y displayed by the pixel array according to the embodiment shown in FIG. 7; and FIG. 10 is a schematic diagram showing a picture (Y+1) displayed by the pixel array according to the embodiment shown in FIG. 7. The picture Y and the picture (Y+1) are two adjacent frames, that is, the picture (Y+1) is displayed immediately after the picture Y has been displayed.

As shown in FIG. 9, to make the picture Y and the picture (Y+1) have the characteristic of dot inversion, the data signals of the two adjacent data lines have opposite polarities in the same frame; and the data signals of the same data line have opposite polarities in two adjacent frames.

For example, in the frame of the picture Y shown in FIG. 9, the polarity of the data signal of the data line D1 is positive, the polarity of the data signal of the data line D2 is negative, and the polarity of the data signal of the data line D3 is positive. Thereby, the polarity of the pixel unit in the first row in the first column is positive, the polarity of the pixel unit in the first row in the second column is negative, the polarity of the pixel unit in the second row in the first column is negative, the polarity of the pixel unit in the second row in the second column is positive, . . . , and so on. And the picture Y having the characteristic of dot inversion shown in FIG. 9 is obtained.

In the frame of the picture (Y+1) shown in FIG. 10, the polarity of the data signal of the data line D1 becomes negative, the polarity of the data signal of the data line D2 becomes positive, and the polarity of the data signal of the data line D3 becomes negative. Thereby, the polarity of the pixel unit in the first row and in the first column is negative, the polarity of the pixel unit in the first row and in the second column is positive, the polarity of the pixel unit in the second row and in the first column is positive, the polarity of the pixel unit in the second row in the second column is negative, . . . , and so on. And the picture Y+1 having the characteristic of dot inversion shown in FIG. 10 is obtained.

Through the above analysis, the characteristic of dot inversion of the pixel array according to this embodiment may be achieved through a column inversion of the data lines, and thus the power consumption is reduced effectively.

In addition, in this embodiment, the transistors in the pixel units have a first connection end adapted to be connected to the data line, with the first connection ends of the transistors in two adjacent rows of pixel units being on the same side. As shown in FIG. 7, the transistor M12 in the pixel unit in the first row and in the second column has a first connection end adapted to be connected to the data line D2. Similarly, the transistors in the pixel units in the second row have first connection ends with the same relative position as that of the first connection end A of the transistor M12.

As shown in FIG. 7, the pixel array further includes common electrode lines COM1 to COM4 quantitatively corresponding to the number of rows of the pixel units. Each of the pixel units further includes a pixel electrode (not shown), and the transistor in each pixel unit further has a second connection end. The second connection end of each of the transistors is connected to the pixel electrode, and storage capacitance is formed between the pixel electrode and a corresponding common electrode line.

By taking the transistor M12 as an example, the transistor M12 further has a second connection end B connected to a corresponding pixel electrode. Storage capacitance C12 is formed between the pixel electrode and the corresponding common electrode line COM1.

Figure 11:
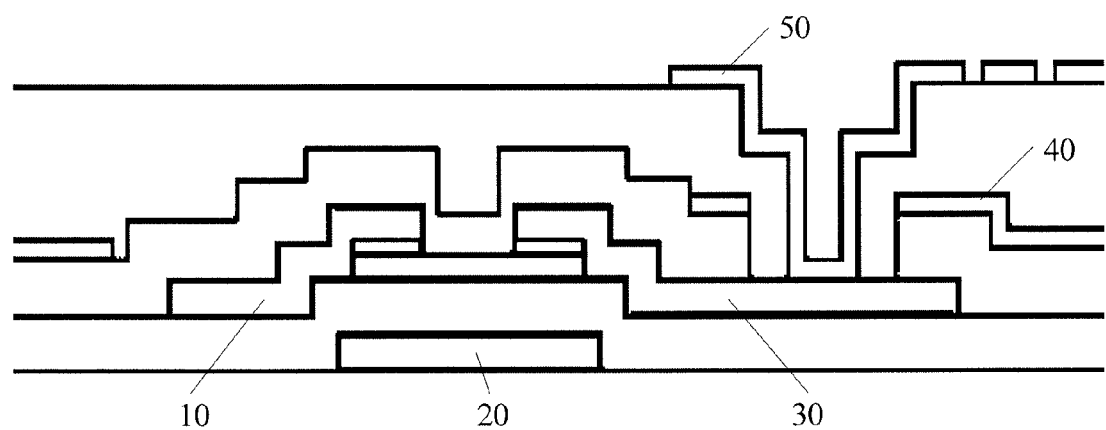
FIG. 11 is a schematic cross-sectional view of one of pixel units in the pixel array according to the an embodiment.

In addition, FIG. 11 is a schematic cross-sectional view showing one pixel unit according to this embodiment. As shown in to FIG. 11, the pixel unit includes a drain electrode 10, a gate electrode 20 and a source electrode 30. The data line (not shown) is connected to the drain electrode 10 of the transistor, and extends in a direction perpendicular to the paper surface. As seen from FIG. 11, in the pixel unit according to this embodiment, the data line connected to the drain electrode 10 of the transistor is under a common electrode line 40 which is under a pixel electrode 50. The data line is further away from the pixel electrode 50, and no signal interference exists between the data line and the pixel electrode. In addition, since the data lines in the pixel array according to this embodiment do not intersect, no signal interference exists between the data lines. The data lines may be made from the same material, thus the process flow is simplified, and the cost is reduced.

Figure 12:
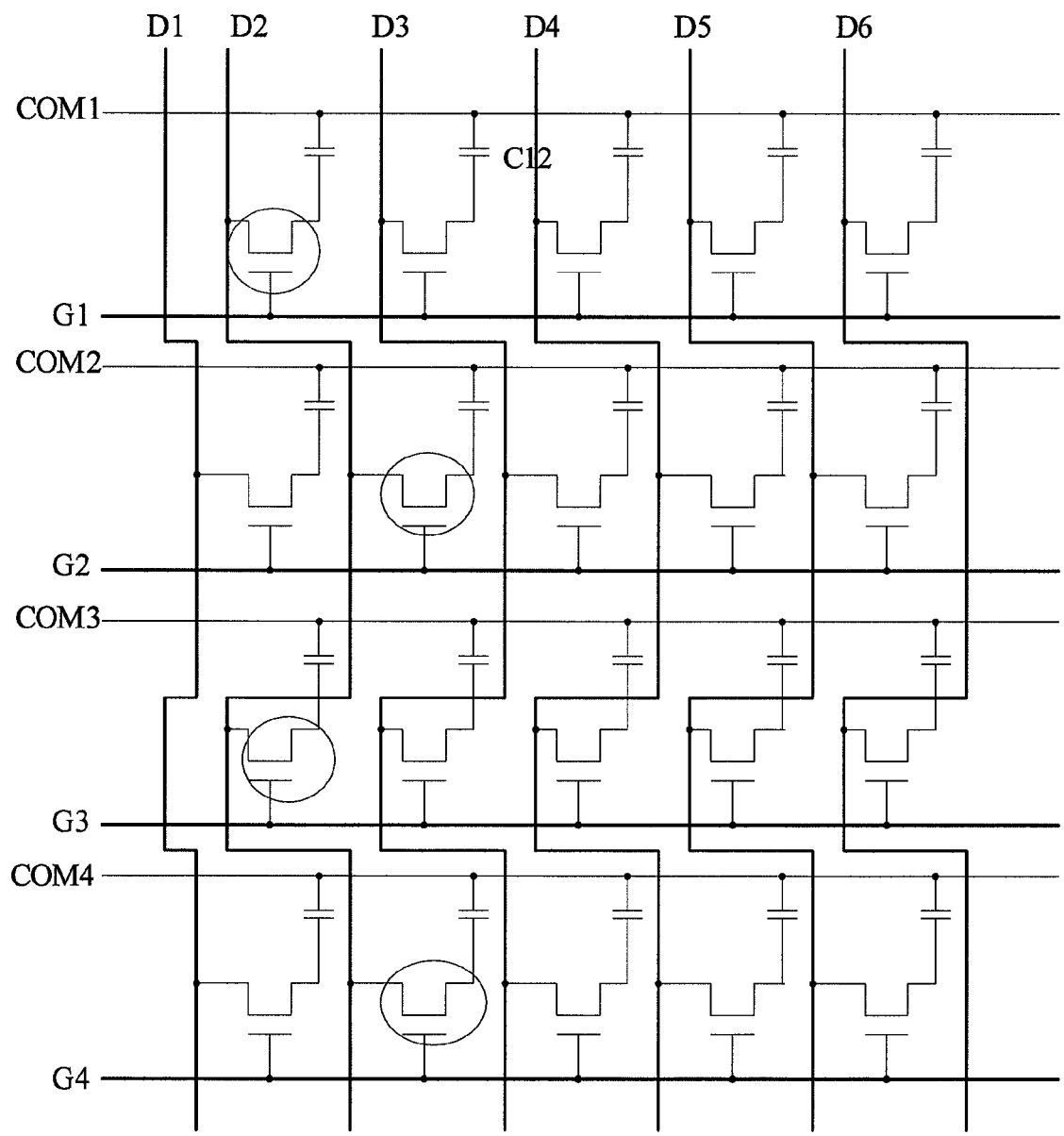
FIG. 12 is an equivalent schematic diagram of a pixel array according to an embodiment of the invention.

FIG. 12 is an equivalent schematic diagram showing a pixel array according to the second embodiment of the invention. As shown in FIG. 12, the pixel array according to this embodiment includes: pixel units, data lines quantitatively corresponding to the number of columns N of the pixel units, and scan lines quantitatively corresponding to the number of rows of the pixel units, wherein transistors in the pixel units are arranged in the same direction;

the pixel units in a same row are connected to a same scan line;

the pixel units in each column and in odd rows are connected respectively to corresponding one of the data lines;

the pixel units in each column and in even rows are connected respectively to corresponding one of the data lines; and the pixel units in the nth column and in even rows and the pixel units in the (n−1)th column and in odd rows are connected to a same data line, where n=2, . . . , N.

The pixel array in this embodiment differs from that in the embodiment shown in FIG. 7 in that the data lines in the pixel array have different curved directions. As shown in FIG. 7, in the pixel array according to the embodiment shown in FIG. 7, the pixel units in even rows and the pixel units in odd rows adjacent thereto in the next column are connected to the same data line. As shown in FIG. 12, in the pixel array according to the second embodiment, the pixel units in even rows and the pixel units in the odd rows adjacent thereto in the previous column are connected to the same data line. For example, in FIG. 12, the pixel unit in the first row and in the first column, the pixel unit in the second row and in the second column, the pixel unit in the third row and in the first column, and the pixel unit in the fourth row and in the second column are connected to the data line D2, and so on, the connection between other pixel units and the data lines is obtained, which is not described here.

The transistors in the pixel units according to this embodiment are arranged in the same direction. Therefore, the problem of interlaced flicker in the pixel array in the prior art is also solved in the pixel array according to this embodiment, and the quality of the picture is improved.

Figure 13:
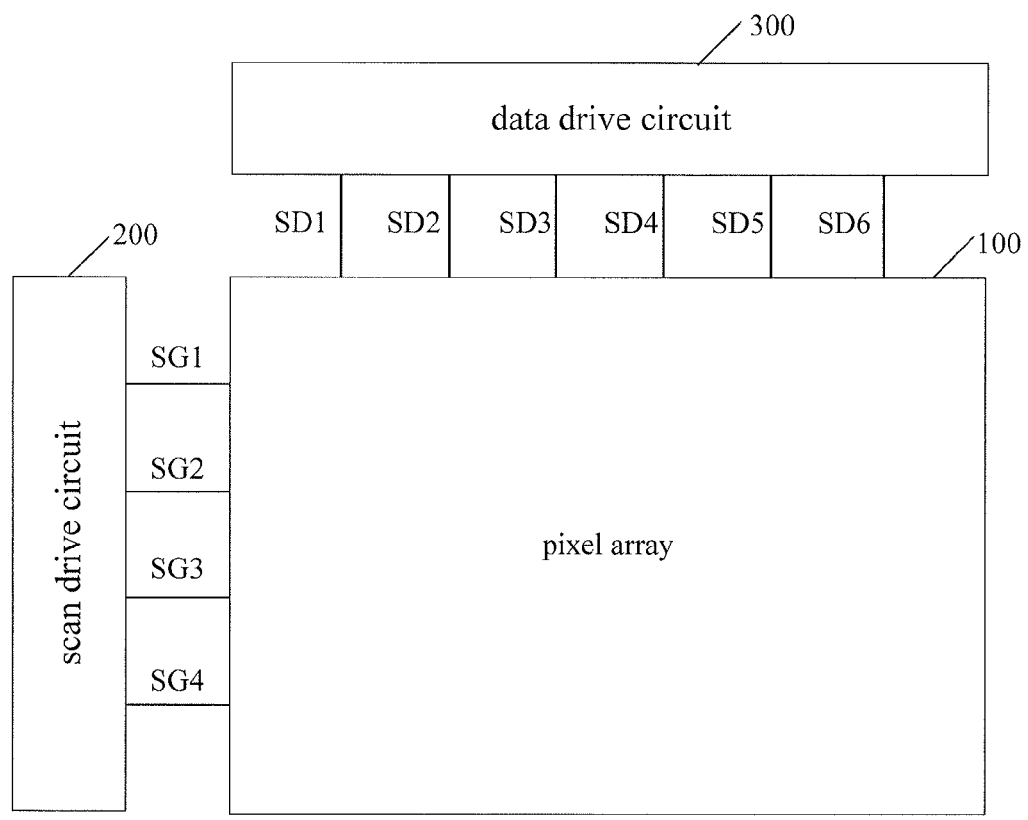
FIG. 13 is a schematic structural diagram of a liquid crystal display device of the invention.

A liquid crystal display device is further provided in the embodiment of the invention, as shown in FIG. 13. The liquid crystal display device includes: a pixel array 100, a scan drive circuit 200 and a data drive circuit 300. In this embodiment, the pixel array 100 includes four rows and five columns of pixel units, but the embodiment of the invention is not limited thereto.

In addition, the pixel array 100 may have either the pixel array structure according to the first embodiment or the pixel array structure according to the embodiment shown in FIG. 12. As for the specific structures, reference may be made to the description about FIG. 7 and FIG. 11, which is not described here.

The scan drive circuit 200 is connected to the scan lines of the pixel array 100 and adapted to provide corresponding scan signals SG1 to SG4 to the scan lines, and the data drive circuit 300 is connected to the data lines of the pixel array 100 and adapted to provide corresponding data signals SD1 to SD6 to the data lines.

In the liquid crystal display device according to this embodiment, the data drive circuit 300 is adapted to provide data signals with opposite polarities to two adjacent data lines in the same frame, and adapted to provide data signals with opposite polarities to the same data line in two adjacent frames.

For example, in a first frame, the polarity of the data signal SD 1 provided by the data drive circuit 300 is positive, the polarity of the data signal SD2 is negative, the polarity of the data signal SD3 is positive, the polarity of the data signal SD4 is negative, the polarity of the data signal SD5 is positive, and the polarity of the data signal SD6 is negative.

In a second frame, the polarity of the data signal SD1 provided by the data drive circuit 300 is negative, the polarity of the data signal SD2 is positive, the polarity of the data signal SD3 is negative, the polarity of the data signal SD4 is positive, the polarity of the data signal SD5 is negative, and the polarity of the data signal SD6 is positive.

It should be further noted that the liquid crystal display device may be a Fringe Field Switching (FFS) type liquid crystal display device, a In-Plane Switching (IPS) type liquid crystal display device, or a Twist Nematic (TN) type liquid crystal display device, but the invention is not limited thereto.

The transistors in the pixel array of the liquid crystal display device according to the embodiments of the invention are arranged in the same direction. Therefore, the problem of interlaced flicker is overcome in liquid crystal display device according to the embodiments of the invention, and the quality of the picture is improved. And since the data lines in the pixel array have a curved arrangement to control staggeringly the pixel units in any two adjacent rows in their two adjacent columns, the characteristic of dot inversion may be achieved by a column inversion of the data lines, and the power consumption is reduced greatly.

Although the embodiments of the invention have been disclosed as above, the embodiments of the invention is not limited thereto. Various alternations and modifications can be made by those skilled in the art without departing from the spirit and scope of the invention. And therefore the scope of protection of the invention should be subjected to the scope defined by the claims.

What is claimed is:

1. A pixel array, comprising: pixel units, data lines quantitatively corresponding to the number of columns N of the pixel units, and scan lines quantitatively corresponding to the number of rows of the pixel units, wherein
   transistors in the pixel units are arranged in a same direction;
   the pixel units in a same row are connected to the same scan line;
   the pixel units in each column and in odd rows are connected respectively to a same corresponding one of the data lines;
   the pixel units in each column and in even rows are connected respectively to another same corresponding one of the data lines; and
   the pixel units in the nth column and in even rows and the pixel units in the (n+1)th column and in odd rows are connected to the same data line, where n=1, 2, . . . , N−1.

2. The pixel array according to claim 1, wherein each transistor in each pixel unit has a first connection end adapted to connect to the data line, with the first connection ends of the transistors in two adjacent rows of pixel units being on the same side.

3. The pixel array according to claim 2, wherein the pixel array further comprises common electrode lines quantitatively corresponding to the number of rows of the pixel units, wherein the pixel unit further comprises a pixel electrode, the transistor further comprises a second connection end connected to the pixel electrode, and storage capacitance is formed between the pixel electrode and a corresponding common electrode line.

4. A pixel array, comprising: pixel units, data lines quantitatively corresponding to the number of columns N of the pixel units, and scan lines quantitatively corresponding to the number of rows of the pixel units, wherein
   transistors in the pixel units are arranged in the same direction;
   the pixel units in a same row are connected to the same scan line;
   the pixel units in each column and in odd rows are connected respectively to corresponding one of the data lines;
   the pixel units in each column and in even rows are connected respectively to corresponding one of the data lines; and
   the pixel units in the nth column in and even rows and the pixel units in the (n−1)th column and in odd rows are connected to the same data line, where n=2, . . . , N.

5. The pixel array according to claim 4, wherein the transistors in the pixel units has a first connection end adapted to connect to the data line, with the first connection ends of the transistors in two adjacent rows of pixel units being on the same side.

6. The pixel array according to claim 5, further comprising common electrode lines quantitatively corresponding to the number of rows of the pixel units, wherein the pixel unit further comprises a pixel electrode, the transistor further comprises a second connection end connected to the pixel electrode, and storage capacitance is formed between the pixel electrode and a corresponding common electrode line.

7. A liquid crystal display device, comprising: a pixel array, a scan drive circuit and a data drive circuit; wherein
   the pixel array comprises pixel units, data lines quantitatively corresponding to the number of columns N of the pixel units, and scan lines quantitatively corresponding to the number of rows of the pixel units, wherein
   transistors in the pixel units are arranged in a same direction;
   the pixel units in a same row are connected to the same scan line;
   the pixel units in each column and in odd rows are connected respectively to corresponding one of the data lines;
   the pixel units in each column and in even rows are connected respectively to corresponding one of the data lines; and
   the pixel units in the nth column and in even rows and the pixel units in the (n+1)th column and in odd rows are connected to the same data line, where n=1, 2, . . . , N−1;
   the scan drive circuit is connected to the scan lines and adapted to provide corresponding scan signals to the scan lines, and the data drive circuit is connected to the data lines and adapted to provide corresponding data signals to the data lines.

8. The liquid crystal display device according to claim 7, wherein the data drive circuit is adapted to provide data signals with opposite polarities to two adjacent data lines in the same frame.

9. The liquid crystal display device according to claim 8, wherein the data drive circuit is adapted to provide data signals with opposite polarities to the same data line in two adjacent frames.

10. The liquid crystal display device according to claim 7, wherein the liquid crystal display device is a Fringe Field Switching (FFS) type liquid crystal display device, a In-Plane Switching (IPS) type liquid crystal display device, or a Twist Nematic (TN) type liquid crystal display device.

11. The liquid crystal display device according to claim 7, wherein the transistors in the each pixel unit have a first connection end adapted to connect to the data line, with the first connection ends of the transistors in two adjacent rows of pixel units being on the same side.

12. The liquid crystal display device according to claim 11, wherein the pixel array further comprises common electrode lines quantitatively corresponding to the number of rows of the pixel units, wherein the pixel unit further comprises a pixel electrode, the transistor further comprises a second connection end connected to the pixel electrode, and storage capacitance is formed between the pixel electrode and a corresponding common electrode line.

13. A pixel array, comprising:
N data lines arranged in columns;
M scan lines arranged in rows;
N*M transistors forming N*M pixel units disposed along intersections of the N data lines and M scan lines;
wherein a first half of M transistors associated with at least a first pair of adjacent data lines have drain regions positioned on a first side of one of the at least first pair of the adjacent data lines to define a first pixel column; and
wherein a second half of M transistors associated with the at least first pair of adjacent data lines have drain regions positioned on the first side of the other one of the at least first pair of the adjacent data lines to define a second pixel column.

14. A pixel array comprising a plurality of pixel units arranged along N columns and M rows, each pixel unit being associated with a different one of a plurality of transistors positioned along intersections of a plurality of data lines and a plurality of scan lines, said data lines being parallel to the N columns and said scan lines being parallel to the M rows;
wherein the plurality of transistors are arranged in a same direction; and
wherein transistors coupled to pth column and qth row are connected to a same date line as transistors coupled to the (p+1)th column and (q+1)th row, wherein p is an integer ranging from 1 to N−1, and q is an integer ranging from 1 to M.

* * * * *